US006194319B1

(12) United States Patent
Carstensen

(10) Patent No.: US 6,194,319 B1
(45) Date of Patent: *Feb. 27, 2001

(54) SEMICONDUCTOR PROCESSING METHOD OF REDUCING AN ETCH RATE OF ONE PORTION OF A DOPED MATERIAL RELATIVE TO ANOTHER PORTION, AND METHODS OF FORMING OPENINGS

(75) Inventor: Robert K. Carstensen, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/389,526

(22) Filed: Sep. 2, 1999

(51) Int. Cl.[7] .................................................. H01L 21/311
(52) U.S. Cl. ........................ 438/700; 438/723; 438/743; 438/618; 438/637
(58) Field of Search ................................ 438/700, 723, 438/734, 743, 618, 637, 705

(56) References Cited

U.S. PATENT DOCUMENTS

| | | | |
|---|---|---|---|
| 4,835,597 | * 5/1989 | Okuyama et al. | 357/52 |
| 5,420,056 | * 5/1995 | Moslehi | 437/40 |
| 5,731,130 | * 3/1998 | Tseng | 430/316 |
| 5,804,515 | * 9/1998 | Park | 438/700 |
| 5,981,376 | * 11/1999 | Komatsu et al. | 438/629 |
| 6,013,547 | * 1/2000 | Liaw | 438/238 |
| 6,022,798 | * 2/2000 | Sumi et al. | 438/637 |

* cited by examiner

Primary Examiner—Matthew Smith
Assistant Examiner—Renzo D. Rocchegiani
(74) Attorney, Agent, or Firm—Wells, St. John, Roberts, Gregory & Matkin, P.S.

(57) ABSTRACT

In one aspect, the invention includes a semiconductor processing method of selectively reducing an etch rate of a doped material. At least some dopant is removed from one portion of the doped material while leaving the dopant in an other portion of the doped material. In another aspect, the invention includes a semiconductor processing method of forming openings. A doped material is provided over a substrate. Openings are etched in the doped material. Dopant in the doped material proximate the openings is depleted relative to other regions of the doped material. In yet another aspect, the invention includes a semiconductor processing method of forming openings. A doped material is provided over a substrate and openings are formed in the doped material. The doped material has a substantially uniform dopant concentration throughout its thickness. One peripheral portion of the openings is defined by the doped material and another peripheral portion is defined by another material. The dopant concentration is depleted from the doped material at the peripheral portion. After the depleting, the peripheral portions of the openings are subjected to an etch to remove the other material.

63 Claims, 3 Drawing Sheets

US 6,194,319 B1

SEMICONDUCTOR PROCESSING METHOD OF REDUCING AN ETCH RATE OF ONE PORTION OF A DOPED MATERIAL RELATIVE TO ANOTHER PORTION, AND METHODS OF FORMING OPENINGS

TECHNICAL FIELD

This invention relates to semiconductor processing method of reducing an etch rate of one portion of a doped material relative to another portion, and methods of forming openings, such as, for example, methods of forming openings in doped materials.

BACKGROUND OF THE INVENTION

Integrated circuitry typically comprises electrical interconnections. A typical semiconductor electrical connection includes a metal or other conductive layer communicating with other layers located at different elevations within a substrate. Forming electrical interconnections is typically conducted, in part, by etching an opening through insulating material, and then flowing metal or other conductive material to within the opening.

An exemplary semiconductor structure comprises a bulk monocrystalline silicon substrate with an overlying silicon dioxide layer as the insulating material, such as borophosphosilicate glass (BPSG). BPSG can be considered to be silicon dioxide doped with phosphorus and boron. An opening can be formed through the BPSG layer and to the underlying substrate with a suitable etch. After etching through the BPSG layer to form the opening, the silicon substrate is exposed to the environment, routinely including oxygen. Silicon reacts with oxygen to form an oxide, specifically silicon dioxide, a material having insulative properties. Accordingly, a film of silicon dioxide, commonly referred to as native oxide, forms on the exposed silicon. If the native oxide is not removed, the conductive properties of an electrical connection formed within the opening can be diminished.

Typically, the native oxide is removed by an etching process, preferably an oxide etch. However, because the BPSG layer is also an oxide and defines the sidewalls of the opening, the sidewalls will etch during removal of the native oxide. The etching of the sidewalls can widen the opening. Moreover, because doped materials etch faster than less doped materials, and because BPSG is essentially a doped oxide, the sidewalls will etch faster than the native oxide. This etch rate differential increases the difficulty to fabricate and control the width dimensions of a opening. With the emphasis in the semiconductor industry to increase the density of active components per unit area of semiconductor substrate, it is typically desired to keep openings narrow. It would, therefore, be desirable to develop improved methods of forming openings in doped substrates.

SUMMARY OF THE INVENTION

In one aspect, the invention includes a semiconductor processing method of selectively reducing an etch rate of a doped material. At least some dopant is removed from one portion of the doped material while leaving the dopant in an other portion of the doped material.

In another aspect, the invention includes a semiconductor processing method of forming openings. A doped material is provided over a substrate. Openings are etched in the doped material. Dopant in the doped material proximate the openings is depleted relative to other regions of the doped material.

In yet another aspect, the invention includes a semiconductor processing method of forming openings. A doped material is provided over a substrate and openings are formed in the doped material. The doped material has a substantially uniform dopant concentration throughout its thickness. One peripheral portion of the openings is defined by the doped material and another peripheral portion is defined by another material. The dopant concentration is depleted from the doped material at the peripheral portion. After the depleting, the peripheral portions of the openings are subjected to an etch to remove the other material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

To aid in interpretation of the claims that follow, the terms "semiconductive substrate" and "semiconductor substrate" are defined to mean any construction comprising semiconductive material including, but not limited to, bulk semiconductor materials such as a semiconductive wafer (either alone or in assemblies comprising other materials thereon), and semiconductive material layers (either alone or in assemblies comprising other materials). The term "substrate" refers to any supporting structure, including, but not limited to, a semiconductive substrates described above.

Figure 1:
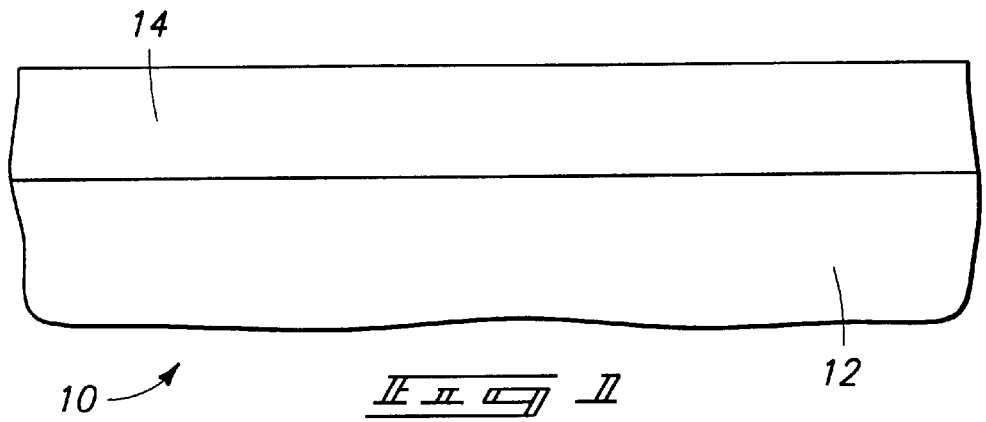
FIG. 1 is a fragmentary sectional view of a semiconductor substrate at one processing step in accordance with a first embodiment of the invention.

FIGS. 1–5 illustrate a semiconductor processing method of selectively reducing an etch rate of a portion of a doped material proximate an opening relative to another portion of a doped material. Referring to FIG. 1, a semiconductive substrate fragment in process is indicated generally by reference numeral 10. Fragment 10 comprises semiconductor substrate 12, preferably a bulk monocrystalline silicon substrate, having a layer 14 of doped material thereon. Doped layer 14 can comprise a doped oxide, such as, for example, a doped silicon dioxide. Preferably, the dopant concentration is substantially uniform throughout the thickness of doped layer 14. Exemplary dopants can comprise one or any combination of phosphorus and boron such that the doped layer 14 can comprise, for example, borophosphosilicate glass (BPSG).

Figure 2:
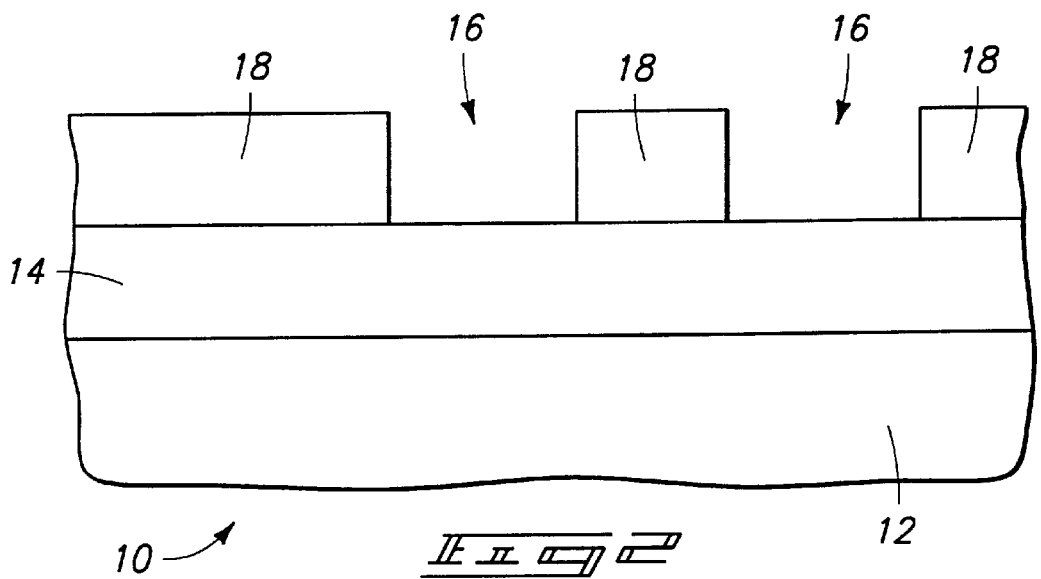
FIG. 2 is a view of the FIG. 1 substrate fragment at a processing step subsequent to that shown in FIG. 1.

Referring to FIG. 2, a masking material 18 is coated over doped layer 14 and patterned with openings 16. An exemplary masking material 18 comprises photoresist. A typical patterning process includes exposing portions of photoresist 18 to light while leaving other portions unexposed. Subsequently, either the exposed or unexposed portions are removed with a solvent to form openings 16.

Figure 3:
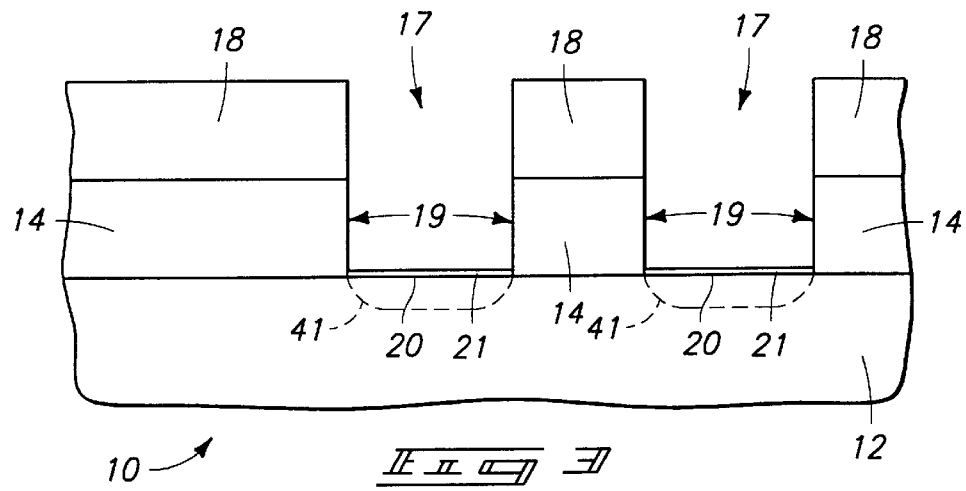
FIG. 3 is a view of the FIG. 1 substrate fragment at a processing step subsequent to that shown in FIG. 2.

Referring to FIG. 3, the patterned photoresist 18 is utilized as a mask for etching openings 17 through doped layer 14 to substrate 12. Dopants can be provided through openings 17 and into substrate 12 to form diffusion regions 41 (shown in phantom to indicate the region could be any other active region). The diffusion regions 41 define electrical nodes 20 comprising an upper surface of silicon substrate 12 exposed to the environment and to which an electrical connection is to be made. Such exposed silicon reacts with the environment, particularly oxygen, to form a film of silicon oxide 21, commonly referred to as native oxide, on electrical node 20. The native oxide 21 defines a bottom periphery of openings 17, while doped layer 14 defines sidewalls 19 of openings 17.

Figure 4:
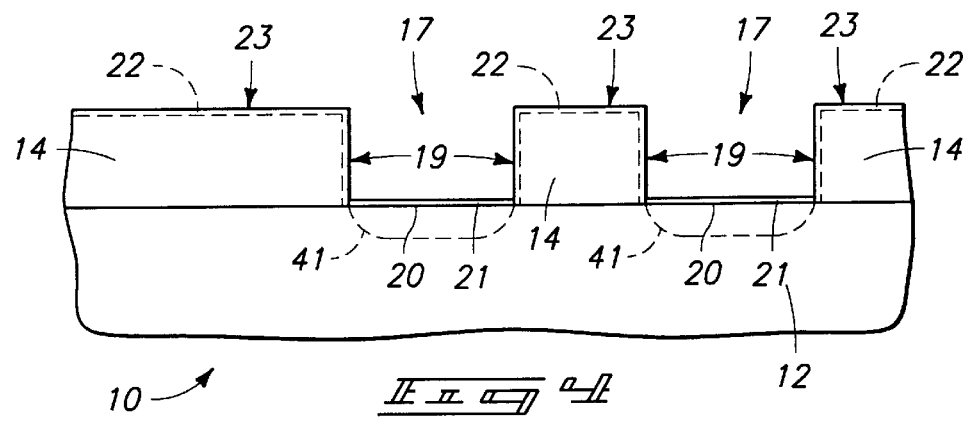
FIG. 4 is a view of the FIG. 1 substrate fragment at a processing step subsequent to that shown in FIG. 3.

Referring to FIG. 4, photoresist 18 is removed by, for example, a piranha clean (solution of hydrogen peroxide and sulfuric acid), exposing an upper surface 23 of doped layer 14 located elevationally above electrical node 20 of substrate 12. After removing photoresist 18, doped layer 14 has a periphery comprising upper surface 23 and sidewalls 19. At least a portion of this periphery, particularly including sidewalls 19, is subjected to a dopant removal treatment to deplete the dopant concentration within a portion of the doped layer 14 exposed to the treatment relative other portions of the doped layer 14 not exposed to the treatment. The dopant removal treatment removes at least one dopant from doped layer 14 to form a depleted region 22. Preferably, enough dopant is removed such that the depleted region 22 has an etch rate substantially the same (i.e., within the same variance tolerances of the current measurement techniques) as an etch rate of native oxide 21.

In one aspect of the invention, doped layer 14 comprises BPSG which effectively includes two dopants, phosphorus and boron, either of which can be removed by the dopant removal treatment. However, in a particular aspect of the invention, phosphorus can be predominately removed relative the boron. In still another particular aspect of the invention, the dopant removal treatment comprises phosphoric acid. An exemplary phosphoric acid solution comprises 100 parts water to 1 part phosphoric acid by volume. The processing environment, including substrate 12 and phosphoric acid solution, is maintained at a temperature of at least about 30° C., and preferably of from about 40° C. to about 50° C.

Figure 5:
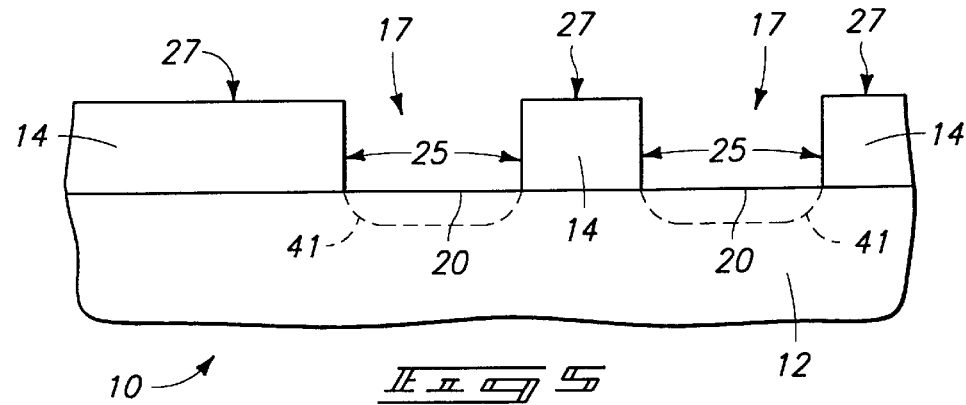
FIG. 5 is a view of the FIG. 1 substrate fragment at a processing step subsequent to that shown in FIG. 4.

Referring to FIG. 5, the native oxide 21 is removed. Such removal can be accomplished with, for example, a wet etch. A suitable etch can comprise one or more of buffered hydrofluoric acid, ammonium fluoride, tetramethyl ammonium hydroxide and phosphoric acid. Since the etch rates of the native oxide 21 and depleted region 22, including sidewalls 19, are substantially the same, the native oxide 21 is removed at substantially the same rate as the BPSG layer 14 in the sidewalls 19 to establish newly dimensioned sidewalls 25 and upper surface 27 both minimally etched back from the original thicknesses. A metal or conductive material layer (not shown) is formed to within the openings to establish an electrical connection. The conductive material can comprise a metal nitride, such as, for example, titanium nitride.

Figure 6:
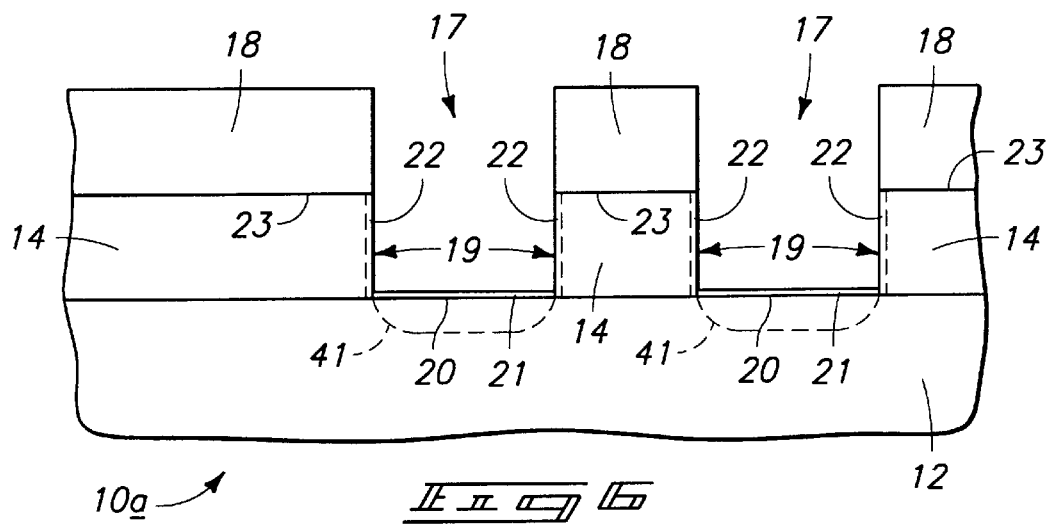
FIG. 6 is a fragmentary sectional view of a semiconductor substrate at one processing step in accordance with a second embodiment of the invention.
Figure 7:
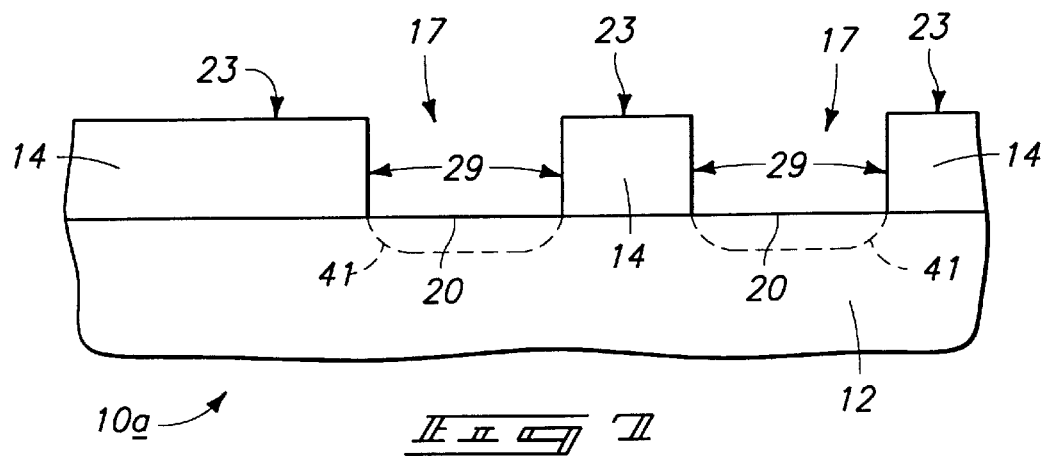
FIG. 7 is a view of the FIG. 6 substrate fragment at a processing step subsequent to that of FIG. 6.

With reference to FIGS. 6–7, another embodiment of the present invention is described. Like numerals from the first described embodiment are employed where appropriate, with differences being indicated with a suffix (a) or with different numerals.

Referring to FIG. 6, a semiconductor substrate fragment in process is indicated generally with reference numeral 10a. In contrast to the embodiment of FIGS. 1–5, photoresist 18 is left over BPSG layer 14 while subjecting the sidewalls 19 to phosphorus acid. The photoresist 18 acts as a barrier to shield the upper surface 23 of BPSG layer 14 from the phosphoric acid during the exposure of sidewalls 19.

Referring to FIG. 7, photoresist 18 is removed. After removing photoresist 18, wafer fragment 10a is subjected to an etch to remove native oxide 21. Once again, since the etch rates of the native oxide 21 and depleted region 22 are substantially the same, the native oxide 21 is removed at substantially the same rate as the BPSG layer 14 in the sidewalls 19 to establish newly dimensioned sidewalls 29. However, in contrast to the embodiment of FIGS. 1–5, there is no depleted region 22 at the upper surface 23 of BPSG 14, so the BPSG etches downwardly at a relatively rapid rate as the native oxide 21 is removed.

In compliance with the statute, the invention has been described in language more or less specific as to structural and methodical features. It is to be understood, however, that the invention is not limited to the specific features shown and described, since the means s herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of selectively reducing an etch rate of one portion of a doped material relative to an other portion of the doped material, comprising removing at least some dopant from said one portion while leaving the dopant in said other portion, and the removing at least some dopant reduces an etch rate of the one portion relative to an etch rate of the other portion, wherein trenches having sidewalls are formed in the doped material and the removing at least some dopant comprises removing at least some dopant from the sidewalls of the trenches.

2. The semiconductor processing method of claim 1 wherein the doped material comprises at least a first dopant material and a second dopant material, and wherein removing at least some dopant comprises selectively removing a predominate concentration of the first dopant material relative to a concentration of the second dopant material.

3. The semiconductor processing method of claim 2 wherein the first dopant material comprises phosphorus and the second dopant material comprises boron.

4. The semiconductor processing method of claim 1 wherein the doped material comprises an oxide.

5. The semiconductor processing method of claim 1 wherein the dopant comprises phosphorus.

6. The semiconductor processing method of claim 1 wherein the doped material comprises phosphorus-doped silicon oxide.

7. The semiconductor processing method of claim 1 wherein the doped material comprises borophosphosilicate glass.

8. The semiconductor processing method of claim 1 wherein the doped material comprises phosphorus-doped-oxide and the selectively reducing an etch rate comprises exposing the phosphorus-doped-oxide to a material which removes phosphorus from phosphorus-doped-oxide.

9. The semiconductor processing method of claim 1 wherein the doped material comprises phosphorus-doped silicon oxide and the selectively reducing an etch rate comprises exposing the phosphorus-comprising silicon oxide to a material which removes phosphorus from phosphorus-comprising silicon oxide.

10. The semiconductor processing method of claim 1 wherein the doped material comprises borophosphosilicate glass and the selectively reducing an etch rate comprises exposing the borophosphosilicate glass to a material which removes phosphorus from borophosphosilicate glass.

11. The semiconductor processing method of claim 1 wherein the removing at least some dopant comprises exposing the doped material to phosphoric acid.

12. The semiconductor processing method of claim 1 wherein the removing at least some dopant comprises exposing the doped material to a phosphoric acid comprising 100 parts water to 1 part phosphoric acid by volume in an environment maintained at a temperature of from about 40° C. to about 50° C.

13. A semiconductor processing method of forming openings comprising:

provided doped material over a substrate;

etching openings in the doped material; and after etching the openings, depleting dopant in the doped material proximate the openings relative to other regions of the doped material, and the depleting dopant in the doped material reduces an etch rate in the doped material proximate the openings relative to an etch rate of the other regions of the doped material.

14. The semiconductor processing method of claim 13 wherein the doped material comprises at least a first dopant material and a second dopant material, and wherein depleting dopant comprises selectively removing a predominate concentration of the first dopant material relative to a concentration of the second dopant material.

15. The semiconductor processing method of claim 14 wherein the first dopant material comprises phosphorus and the second dopant material comprises boron.

16. The semiconductor processing method of claim 13 wherein the doped material comprises phosphorus-doped-oxide.

17. The semiconductor processing method of claim 13 wherein the doped material comprises phosphorus-comprising silicon oxide.

18. The semiconductor processing method of claim 13 wherein the doped material comprises borophosphosilicate glass.

19. The semiconductor processing method of claim 13 wherein the doped material comprises phosphorus-doped-oxide and the depleting dopant comprises exposing the phosphorus-doped-oxide to a material which removes phosphorus from the phosphorus-doped-oxide.

20. The semiconductor processing method of claim 13 wherein the doped material comprises phosphorus-comprising silicon oxide and the depleting dopant comprises exposing the phosphorus-comprising silicon oxide to a material which removes phosphorus from the phosphorus-comprising silicon oxide.

21. The semiconductor processing method of claim 13 wherein the doped material comprises borophosphosilicate glass and the depleting dopant comprises exposing the borophosphosilicate glass to a material which removes phosphorus from borophosphosilicate glass.

22. The semiconductor processing method of claim 13 wherein the depleting dopant comprises exposing the doped material to phosphoric acid.

23. The semiconductor processing method of claim 13 wherein the depleting dopant comprises exposing the doped material to a phosphoric acid comprising 100 parts water to 1 part phosphoric acid by volume in an environment maintained at a temperature of from about 40° C. to about 50° C.

24. A semiconductor processing method of forming openings, comprising:

providing a doped material over a substrate;

forming openings having sidewalls in the doped material, the doped material having a substantially uniform dopant concentration throughout its thickness, the openings having a peripheral portion including the sidewalls defined by the doped material and another peripheral portion defined by another material, the doped material defining other portions relative the peripheral portions;

depleting the dopant concentration in the doped material of the peripheral portion, and the depleting the dopant concentration reduces an etch rate of the doped material of the peripheral portion relative to an etch rate of the other portions defined by the doped material; and after the depleting, subjecting the peripheral portions of the openings to an etch to remove the other material.

25. The semiconductor processing method of claim 24 wherein the doped material comprises at least a first dopant material and a second dopant material, and wherein depleting the dopant concentration comprises selectively removing a predominate concentration of the first dopant material relative to a concentration of the second dopant material.

26. The semiconductor processing method of claim 25 wherein the first dopant material comprises phosphorus and the second dopant material comprises boron.

27. The semiconductor processing method of claim 24 wherein the dopant comprises phosphorus.

28. The semiconductor processing method of claim 24 wherein the doped material comprises phosphorus-comprising silicon oxide.

29. The semiconductor processing method of claim 24 wherein the doped material comprises borophosphosilicate glass.

30. The semiconductor processing method of claim 24 wherein the doped material and other material have the same composition excluding dopant concentration, and the doped material has a greater etch rate relative the other material.

31. The semiconductor processing method of claim 24 wherein the doped material and other material comprise oxides.

32. The semiconductor processing method of claim 31 wherein the depleting dopant concentration comprises exposing the doped oxide to phosphoric acid.

33. The semiconductor processing method of claim 31 wherein the depleting dopant concentration comprises exposing the doped oxide to a phosphoric acid comprising 100 parts water to 1 part phosphoric acid by volume in an environment maintained at a temperature of from about 40° C. to about 50° C.

34. The semiconductor processing method of claim 24 wherein the depleting comprises depleting the dopant concentration to a level having an etch rate substantially the same as an etch rate of the other material.

35. The semiconductor processing method of claim 24 wherein the etch utilizes one or more of buffered hydrofluoric acid, ammonium fluoride, tetramethyl ammonium hydroxide and phosphoric acid.

36. The semiconductor processing method of claim 24 wherein the doped material comprises phosphorus-doped-oxide and the depleting dopant concentration comprises exposing the phosphorus-doped-oxide to phosphoric acid.

37. The semiconductor processing method of claim 24 wherein the doped material comprises borophosphosilicate glass and the depleting dopant concentration comprises exposing the borophosphosilicate glass to a phosphoric acid comprising 100 parts water to 1 part phosphoric acid by volume in an environment maintained at a temperature of from about 40° C. to about 50° C.

38. A semiconductor processing method of forming openings in a doped oxide comprising:
providing a substrate;
depositing a doped oxide on the substrate;
forming a patterned masking material over the doped oxide, the patterned masking material covering a portion of the doped oxide and leaving another portion exposed;
removing the exposed portion of doped oxide to form openings, the doped oxide defining a peripheral portion of the openings and defining other portions not the peripheral portion of the openings, and another oxide defining another peripheral portion of the openings;
depleting dopant of the doped oxide of at least the peripheral portion, and the depleting dopant of the doped oxide reduces an etch rate of at least the peripheral portion relative to an etch rate of the other portions of the doped oxide; and
after the depleting, subjecting at least the peripheral portions of the openings to an etch to remove the other oxide.

39. The semiconductor processing method of claim 38 wherein the doped oxide comprises at least a first dopant material and a second dopant material, and wherein depleting dopant of the doped oxide comprises selectively removing a predominate concentration of the first dopant material relative to a concentration of the second dopant material.

40. The semiconductor processing method of claim 39 wherein the first dopant material comprises phosphorus and the second dopant material comprises boron.

41. The semiconductor processing method of claim 38 further comprising after the removing of the doped oxide to form openings, removing the photoresist material.

42. The semiconductor processing method of claim 38 further comprising leaving the photoresist material coated on the doped oxide until after the step of the depleting dopant.

43. The semiconductor processing method of claim 38 wherein the doped oxide comprises phosphorous-doped-oxide.

44. The semiconductor processing method of claim 38 wherein the doped oxide comprises phosphorus-comprising silicon oxide.

45. The semiconductor processing method of claim 38 wherein the doped oxide comprises borophosphosilicate glass.

46. The semiconductor processing method of claim 38 wherein the etch to remove the other oxide utilizes one or more of buffered hydrofluoric acid, ammonium fluoride, tetramethyl ammonium hydroxide and phosphoric acid.

47. The semiconductor processing method of claim 38 wherein the dopant comprises phosphorus.

48. The semiconductor processing method of claim 38 wherein the depleting dopant comprises depleting the dopant concentration to a level having an etch rate substantially the same as an etch rate of the other oxide.

49. The semiconductor processing method of claim 38 wherein the doped oxide comprises borophosphosilicate glass, and the depleting dopant comprises exposing the borophosphosilicate glass to phosphoric acid.

50. The semiconductor processing method of claim 38 wherein the doped oxide comprises borophosphosilicate glass, and the depleting dopant comprises exposing the borophosphosilicate glass to a phosphoric acid comprising 100 parts water to 1 part phosphoric acid by volume in an environment maintained at a temperature of from about 40° C. to about 50° C.

51. A semiconductor processing method of selectively reducing an etch rate of one portion of a doped material relative to an other portion of the doped material, comprising:
selectively removing at least some dopant from said one portion while selectively leaving the dopant in said other portion, and the selectively removing at least some dopant comprising selectively removing dopant from an area within said one portion of doped material.

52. The semiconductor processing method of claim 51 wherein the doped material comprises at least a first dopant material and a second dopant material, and wherein selectively removing at least some dopant comprises selectively removing a predominate concentration of the first dopant material relative to a concentration of the second dopant material.

53. The semiconductor processing method of claim 52 wherein the first dopant material comprises phosphorus and the second dopant material comprises boron.

54. The semiconductor processing method of claim 51 wherein the doped material comprises an oxide.

55. The semiconductor processing method of claim 51 wherein the dopant comprises phosphorus.

56. The semiconductor processing method of claim 51 wherein the doped material comprises phosphorus-doped silicon oxide.

57. The semiconductor processing method of claim 51 wherein the doped material comprises borophosphosilicate glass.

58. The semiconductor processing method of claim 51 wherein the doped material comprises phosphorus-doped-oxide and the selectively reducing an etch rate comprises exposing the phosphorus-doped-oxide to a material which removes phosphorus from phosphorus-doped-oxide.

59. The semiconductor processing method of claim 51 wherein the doped material comprises phosphorus-doped silicon oxide and the selectively reducing an etch rate comprises exposing the phosphorus-comprising silicon oxide to a material which removes phosphorus from phosphorus-comprising silicon oxide.

60. The semiconductor processing method of claim 51 wherein the doped material comprises borophosphosilicate glass and the selectively reducing an etch rate comprises exposing the borophosphosilicate glass to a material which removes phosphorus from borophosphosilicate glass.

61. The semiconductor processing method of claim 51 wherein the removing at least some dopant comprises exposing the doped material to phosphoric acid.

62. The semiconductor processing method of claim 51 wherein the removing at least some dopant comprises exposing the doped material to a phosphoric acid comprising 100 parts water to 1 part phosphoric acid by volume in an environment maintained at a temperature of from about 40° C. to about 50° C.

63. A semiconductor processing method of forming openings, comprising:
providing a doped material over a substrate;
forming openings in the doped material, the doped material having a substantially uniform dopant concentration throughout its thickness, the openings having a peripheral portion defined by the doped material and another peripheral portion defined by another material, the peripheral portion defined by the doped material having a surface, at least a portion of the surface defining a sidewall within the openings;

depleting the dopant concentration in the doped material of the peripheral portion, and the dopant concentration is depleted from an area within the doped material extending from the surface of the peripheral portion defined by the doped material; and after the depleting, subjecting the peripheral portions of the openings to an etch to remove the other material.

* * * * *